United States Patent [19]

Mooradian

[11] Patent Number: 5,050,179
[45] Date of Patent: Sep. 17, 1991

[54] EXTERNAL CAVITY SEMICONDUCTOR LASER

[75] Inventor: Aram Mooradian, Winchester, Mass.

[73] Assignee: Massachusetts Institute of Technology, Cambridge, Mass.

[21] Appl. No.: 341,028

[22] Filed: Apr. 20, 1989

[51] Int. Cl.$^5$ .............................................. H01S 3/19
[52] U.S. Cl. ..................... 372/44; 372/101; 372/103
[58] Field of Search ................ 372/18, 19, 44, 101, 372/103

[56] References Cited

PUBLICATIONS

Yaeli et al., "Array Mode Selection Utilizing an External Cavity Configuration", *Applied Physics Letters,* vol. 47, No. 2, Jul. 1985, pp. 89'91.

Wagner et al., "Operating Characteristics of Single-Quantum-Well Al/GaAs/GaAs High-Power Lasers", Quantum Electronics, 24, Jul. 1988, pp. 1258-1265.

Goldberg et al., "Single Lobe Operation of a 40-Element Laser Array in an External Ring Laser Cavity", Applied Physics Letters, 51, Sep. 1987, pp. 871-873.

Fleming et al., "Spectral Characteristics of External-Cavity Controlled Semiconductor Lasers", Quantum Electronics, QE-17, Jan. 1981, pp. 44-59.

Kogelnick, "Imaging of Optical Modes-Resonators with Internal Lenses", The Bell System Technical Journal, XLIV, Jan. 1865, pp. 455-494.

Wyatt et al., "10 kH$_z$ Linewidth 1.5 m InGaAsP External Cavity Laser with 55 nm Tuning Range", Electronics Letters, 19, Feb. 1983, pp. 110-112.

Bachert et al., "Mode Deformation Due to Self-Focusing in Injection Lasers and its Connection with Nonlinearity of the Output Characteristic", Soviet Journal of Quantum Electronics, 5, Mar. 1978, pp. 346-349.

Harrison et al., "Spectral Linewidth of Semiconductor Lasers", Methods of Laser Spectroscopy, Jan. 1985, pp. 133-142.

Arnaud, "Degenerate Optical Cavities", Applied Optics, 8, Jan. 1969, pp. 189-195.

Philipp-Rutz, "High-Radiance Room-Temperature GaAs Laser with Controlled Radiation in a Single Transverse Mode", Quantum Electronics, QE-8, Jun. 1972, pp. 632-641.

Chang-Hasnain et al., "High Power with High Efficiency in a Narrow Single-Lobed Beam from a Diode Laser Array in an External Cavity", Applied Physics Letters, 50, Apr. 1987, pp. 1465-1467.

Sharfin et al., "High-Power, Diffraction-Limited, Narrow-Band, External-Cavity Diode Laser", Applied Physics Letters, 54, Feb. 1989, pp. 1731-1733.

Primary Examiner—William L. Sikes
Assistant Examiner—Robert E. Wise
Attorney, Agent, or Firm—Hamilton, Brook, Smith & Reynolds

[57] ABSTRACT

An external cavity semiconductor laser comprising a resonance cavity coupled to a diode laser. The cavity may contain a lens or lens system or may be constructed as an optical waveguide. The external cavity may also contain a nonlinear optical material to produce light of a frequency which is higher than that produced by the semiconductor laser. The use of an external cavity insures the single mode and/or single frequency operation of the semiconductor laser.

24 Claims, 7 Drawing Sheets

EXTERNAL CAVITY SEMICONDUCTOR LASER

The Government has rights in this invention pursuant to contract Number F19628-85-C-0002 awarded by the Department of the Air Force.

BACKGROUND

This invention relates to the single-frequency, broadly tunable, and single spatial mode high power operation of semiconductor diode lasers.

The peak output power from a diode laser is proportional to the active area of the emitting facet of the device and is limited by catastrophic degradation. To increase the output power from semiconductor diode lasers, it is necessary to increase the area of the active gain region. However, monolithic diode lasers with large emitting areas produce a broad spectral output because they usually operate in many spatial modes and/or filaments. In addition, monolithic diode lasers have an output wavelength which is usually centered near the gain peak and can not be easily tuned. Large active area devices are those with a Fresnel number describing the cavity given by $F = \simeq D^2/\lambda l > 1$, where D is the width of the active gain region, l is the cavity length and $\lambda$ is the wavelength of the laser. Note that although the width of the active gain region is referred to, the height of the active gain region in most monolithic diode lasers is usually comparable to the wavelength of light and the wave is guided in this direction. The same Fresnel consideration applies to the height of the active region when the wave is not guided.

As the width of the active region increases, there is enough total gain perpendicular to the direction of the resonant cavity that stimulated emission begins to become large along this direction compared to the preferred direction. This in turn has two effects. First, it takes away energy from the preferred direction of emission and second, it contributes to the propagation of dark line defects in the device. Dark line defects are well known and are defects which can absorb both spontaneous and stimulated radiation and thereby degrade the performance of the laser. As these dark line defects increase in number and are distributed through the crystal due to optical radiation, the device is damaged further and lasing may no longer occur.

In addition, there is what is termed as filamenting. In filamenting, multiple portions of the gain region can lase independently due to such effects as nonuniform current injection into the gain region and poor uniformity of material. Instead of being uniformly radiating, the emission pattern occurs with many intense peaks. When this uncontrolled filamenting occurs, the local field intensity of laser light at the facet can exceed that which is necessary to cause catastrophic degradation.

The use of an external cavity on a semiconductor laser can overcome the problems described above. Use of an external cavity will reduce stimulated emission in all directions except that defined by the external cavity and will also reduce spontaneous emission by clamping the gain at a value lower than that usually occurring in the monolithic device thereby reducing the production rate of such dark line defects. In addition, because there is usually no spectral nor spatial hole burning in semiconductor lasers, it is possible to extract nearly all of the multimode output power from a monolithic diode laser in a single frequency when the output is controlled in a single spatial mode using an external cavity. Such external cavity devices may then be easily tuned over a broad spectral bandwidth and frequency converted using techniques described below.

SUMMARY OF THE INVENTION

The external cavity laser according to one aspect of the invention includes a monolithic diode laser attached to one end of an external resonator. The external resonator has an optically aligned output coupling mirror attached at the end of the resonator opposite the laser and beam shaping optics disposed between the mirror and the laser. The optical elements are arranged so that only one spatial mode will oscillate.

Another aspect of this invention includes a monolithic diode laser having an impurity level and which is attached to an external cavity such that radiative transitions involving the impurity level are selected.

In one embodiment, the resonant cavity includes a spherical lens and a planar mirror. In another embodiment the cavity includes a cylindrical lens and a spherical mirror. In still another embodiment, the cavity includes a spherical lens and a cylindrical mirror. In yet another embodiment the cavity includes multiple spherical lenses and either a planar or cylindrical mirror.

In an alternate embodiment, the beam shaping optics includes a waveguide. In this embodiment, a planar mirror is attached to the end of the waveguide opposite to the laser. In another alternate embodiment, the waveguide contains a cylindrical lens between the laser and the planar mirror. In still another alternate embodiment, the waveguide contains a non linear optical material between the mirror and the laser.

The external cavity laser according to this invention employs a semiconductor laser attached to an external resonator which may have several forms. This construction creates a laser which operates with a single spatial mode.

DESCRIPTION OF THE PREFERRED EMBODIMENT

Figure 1A:
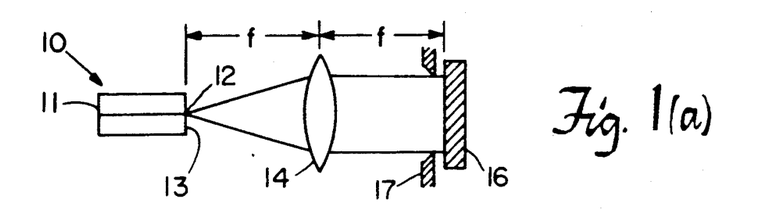
FIG. 1(a) is a schematic illustration of a side view of an optical cavity with a spherical lens.
Figure 1B:
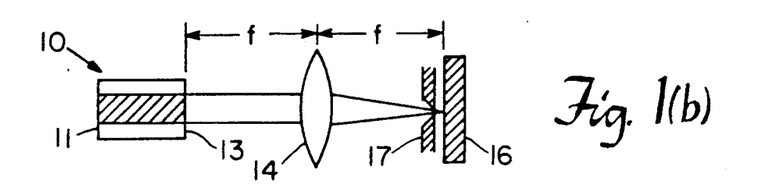
FIG. 1(b) is the top view of the optical cavity of FIG. 1(a).

Referring to FIG. 1(a), a semiconductor laser with a reflective back surface 11 and an antireflective front surface 13 is attached to an optical resonator consisting of a spherical lens 14 and a planar mirror 16. As the laser light diverges from the small dimension of the emitting facet 12 it is collected by the lens 14 located one focal length from the facet 12. The light so collected is collimated onto the planar mirror 16 through a mode aperture 17 and reflected back through the spherical lens 14 to be refocused onto the laser facet 12. The dimensions of the aperture are such that only the fundamental spatial mode will propagate in the laser resonator. Because the mirror 16 is only partially reflecting, some of the laser light passes through for use. The laser light in FIG. 1(a) may be waveguided in the plane of the diode laser junction region but not necessarily in the same guiding region which occurs in the monolithic device. Guiding in a larger region may be accomplished by confinement in layers of different refractive index which occur above and/or below the usual region of the monolithic device. For devices with a large enough optical transparency region, there will be no guiding and the usual Guassian mode optics apply. Referring to FIG. 2(b), since the laser is constructed so that the width of the emitting region is much larger than the height, the fundamental mode is brought to a focus at mirror 16 through the mode aperture 17 in a manner consistent with the usual Gaussian optics for a laser resonator. In this case, the length of the diode is small compared to the length of the external cavity. When the length of the diode laser is not small compared to the length of the external cavity the wave must be either guided in both dimensions inside the diode or the diode should be optically transparent such that a fundamental spatial mode of the external cavity may propagate in both dimensions inside the diode laser device.

Dark line defects are thought to occur and propagate primarily because of the spontaneous emission within the diode laser itself. If the threshold for stimulated emission can be lowered by control of the diode laser cavity parameters such as an external cavity, the gain will be clamped at a lower level than usually occurs for the monolithic device thereby lowering the level of spontaneous emission.

To suppress filamenting, an antireflection coating of sufficiently low reflectivity is applied to one or both sides of the diode laser depending on the external cavity geometry. The external cavity device can then be operated in the fundamental spatial mode which will provide a well defined field intensity at the diode laser facet without hot spots associated with filamenting, thereby allowing the laser to be driven near the limit of catastrophic degradation. This, together with increasing the size of the mode area in the diode laser over that for the monolithic device by the use of an external cavity will allow operation of the laser at higher power levels than that for the monolithic device.

Figure 4:
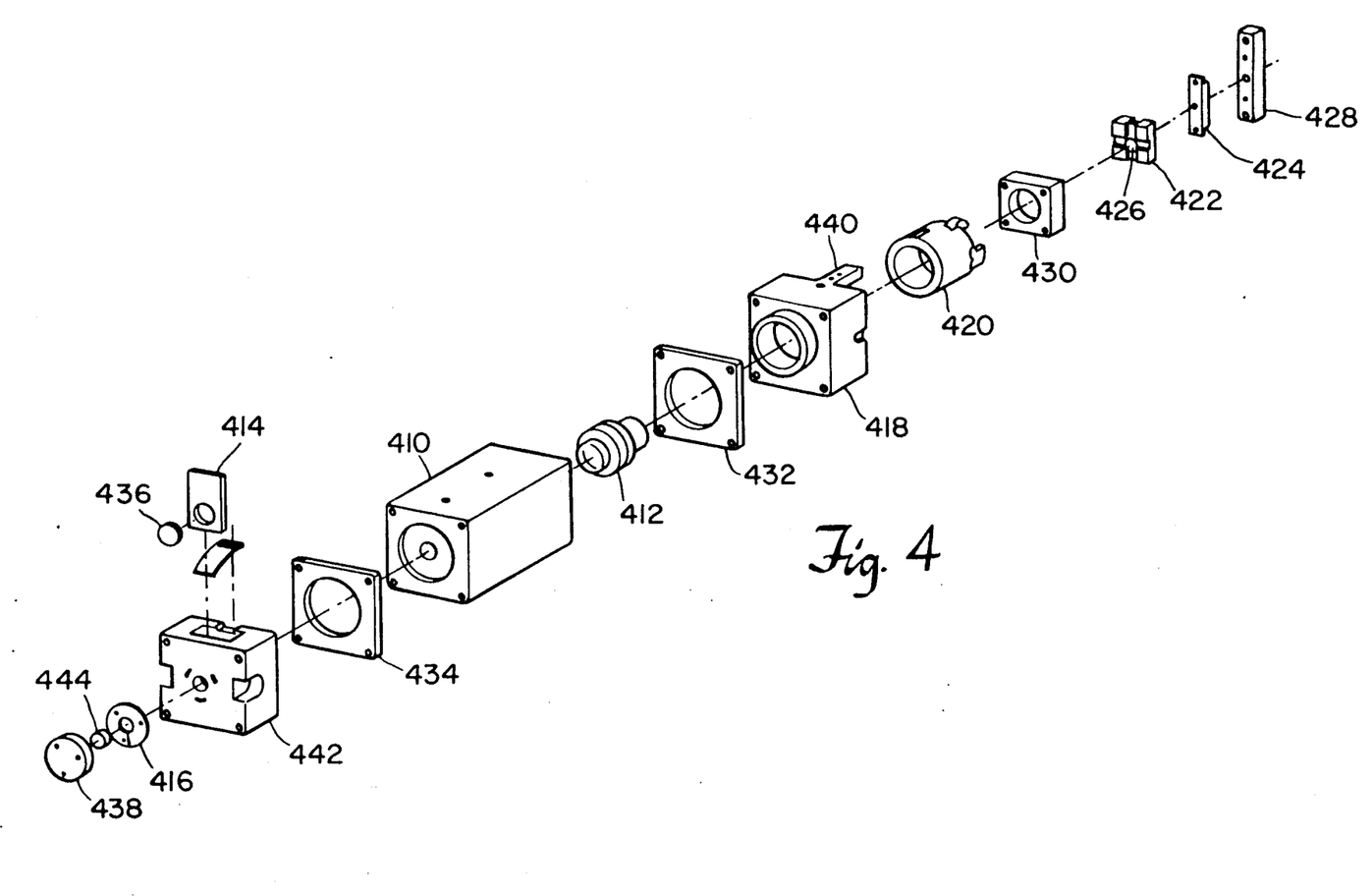
FIG. 4 is an exploded view of the components of the laser cavity.

For the single mode laser to remain stable, the external cavity must be kept rigid. Transverse flexing of the external cavity structure should not allow the image of the external cavity mode to be displaced by more than approximately a few per cent of the mode waist width at the diode laser facet in order to insure stable single spatial mode operation. The length of the cavity should not change according to the known laser art in order to insure stable, single frequency operation. Materials such as Zerodur TM and Super Invar TM which have a low or zero coefficient of thermal expansion at room temperature are used in the critical parts of the structure which define the cavity length. Referring to FIG. 4, an external cavity laser comprises a cavity spacer 410 which houses a lens assembly 412. The lens assembly 412 fits into a positioning barrel 420 which is movably mounted in a positioning bracket 418. The barrel 420 is made so as to move along the axis of the cavity and thereby allow the focusing of the light from the laser diode 426.

The laser diode 426 is mounted within a copper heat sink 422 and heat sink 422 and diode 426 are rigidly mounted to a mounting bracket 424. The mounting bracket 424 is movably mounted to an adjustment stop 428 which is affixed to the tabs 440 of the positioning bracket 418. A ceramic bracket having a low or zero coefficient of thermal expansion 430 is attached to the heat sink 422 to thermally isolate the diode 426 from the rest of the cavity. Two flat seals 432 and 434 separate the positioning bracket 418 and the mirror bracket 442 respectively.

The mirror bracket 442 holds a mirror 444 at one end of the cavity. The mirror 444 is constrained not to move relative to the cavity by use of a crushable gasket 416 and a mirror retraining bracket 438.

The cavity so designed will be not only constant in length but will also not be susceptible to flexing which will change the optical alignment. It should be noted that any change in the length of the cavity does not result in misalignment since the image will still appear on axis with respect to the diode.

It should also be mentioned that the laser cavity can include tuning etalons 436 or gratings. For example, an etalon with a free spectral range greater than twice the gain bandwidth of the diode is held in an etalon bracket 414 and secured in position within the mirror bracket 442. In this way tuning of the external cavity laser over its entire bandwidth can be accomplished by tilting the etalon.

Figure 1C:
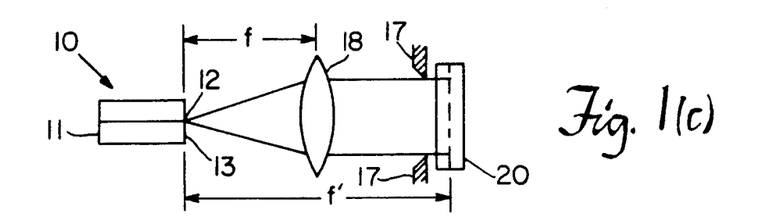
FIG. 1(c) is a side view of an optical cavity with a cylindrical lens.
Figure 1D:
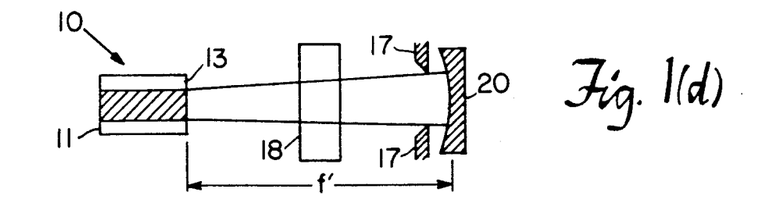
FIG. 1(d) is the top view of the optical cavity of FIG. 1(c).

Referring to FIG. 1(c), the embodiment shown is similar to that of FIG. 1(a), except that cylindrical lens 18 is located one focal length from the laser facet 12. The light from the facet 12 is collimated through an aperture 17 onto a spherical mirror 20. The focal point of the spherical mirror 20 is at the facet 12 of the laser 10. The cylindrical lens 18 is used because the facet 12 is extended in one direction and need not be focused. The lens 18 is therefore oriented along the line of the facet 12. Referring to FIG. 1(d), the lack of focus with this orientation of the cylindrical lens 18 is readily apparent.

Figure 1E:
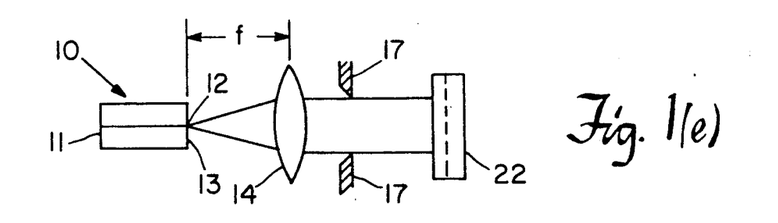
FIG. 1(e) is a side view of an optical cavity with a spherical lens and cylindrical mirror.
Figure 1F:
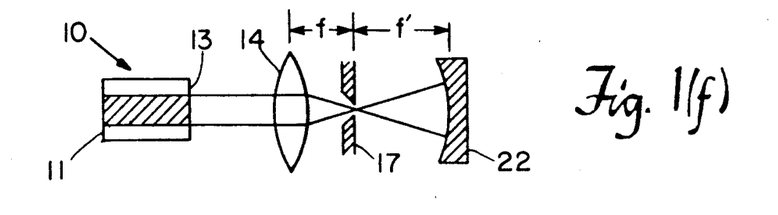
FIG. 1(f) is the top view of the optical cavity FIG. 1(e).

Referring to FIG. 1(e), this is the embodiment shown in FIG. 1(a), but with a cylindrical mirror 22 located at a distance from the lens 14 equal to the focal length of the spherical lens 14 plus the focal length of the cylindrical mirror 22. In such an arrangement, the lens 14 in conjunction with the aperture 17 collimates light in the direction of orientation of the mirror 22 so that the mirror acts as a planar reflector. Referring to FIG. 1(f), however, in the other direction, the light is defocused by the passage of the beam through the focal point of the lens 14, and is refocused by the mirror 22 upon reflection so as to be collimated along the length of the facet 12.

Figure 1G:
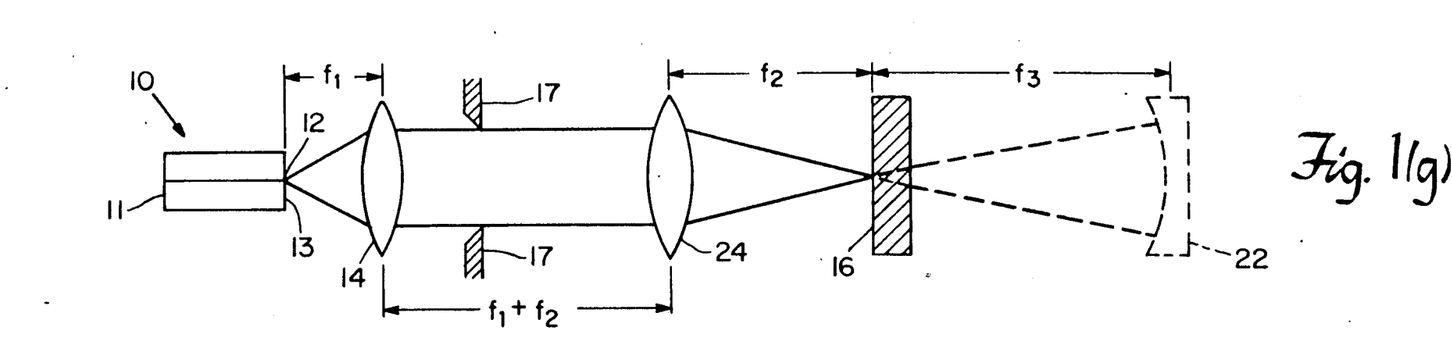
FIG. 1(g) is a side view of an optical cavity of a two spherical lens system with a flat or cylindrical (shown in phantom) mirror.
Figure 1H:
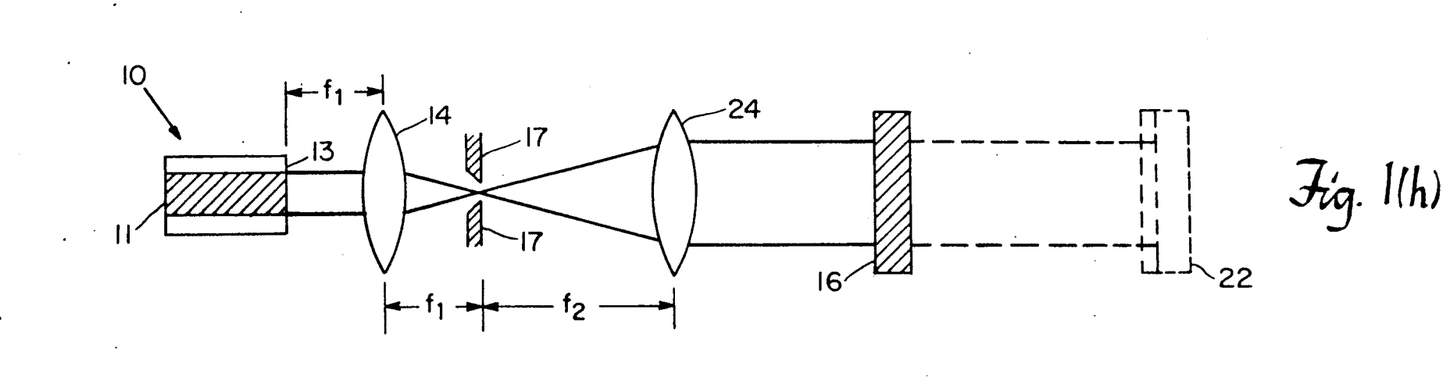
FIG. 1(h) is the top view of the optical cavity of FIG. 1(g)

Referring to FIG. 1(g), a two lens embodiment of the geometric optical cavity is shown. As previously described, the first spherical lens 14 is positioned one focal length away from the laser facet 12 and collimates the divergent beam. This collimated beam passes through an aperture 17 and through a second lens 24 located at a distance away from the first lens 14 equal to the focal length of the first lens 14 plus the focal length of the second lens 24. The second lens 24 refocuses the beam onto either a planar mirror 16 located at a distance of the focal length of the second lens 16 or on a cylindrical mirror 22 (shown in phantom), which is located at to a distance away from the second lens 24 equal to the focal length of the second lens 24 plus the focal length of the mirror 22. Referring to FIG. 1(h), the top view of FIG. 1(g) shows the positioning of the lenses 14 and 24 so as to produce a collimated beam on the facet 10 and mirrors 16 or 22 (shown in phantom) while inverting the beam passing through the pair of lenses 14 and 24.

Figure 2A:
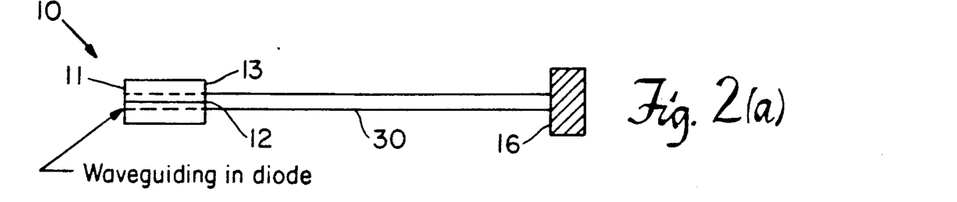
FIG. 2(a) is a schematic illustration of a side view of a single mode waveguide optical cavity resonator.
Figure 2B:
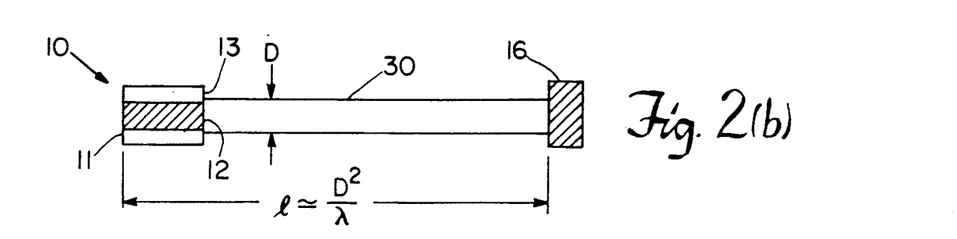
FIG. 2(b), is the top view of the waveguide optical cavity of FIG. 2(a).

Referring to FIG. 2(a), the diode laser 10 is attached to a waveguide optical cavity comprising a grazing incidence or a single mode waveguide 30 and a planar output coupling mirror 16. The waveguide 30 is attached at the laser so as to be symmetric about the emitting facet 12. The laser has a highly reflective coating 11 on the surface away from the waveguide 30. The mirror 16 is located at a distance l from this highly reflective coating 11. Referring to FIG. 2(b), D is the width of the grazing incidence waveguide and is approximately equal to the facet 12 width. For wide diode laser devices only a grazing incidence waveguide is appropriate. The length l of the waveguide and the width D must satisfy the relationship:

$D^2/l\lambda \sim 1$, where $\lambda$ is the wavelength of the laser.

For example, in the case of a GaAlAs laser with a wavelength of 850 nm and an active facet width of 150 $\mu$m, the length of the waveguide is about 2.6 cm. Waveguides of this size are easily created by one skilled in the art using known technology. For example, cavities could be formed by single crystal silicon etching, metal electroforming, or plastic moulding followed by metal coating, for example, gold. Such cavities are easily mass-produced leading to low cost single mode lasers.

Figure 2C:
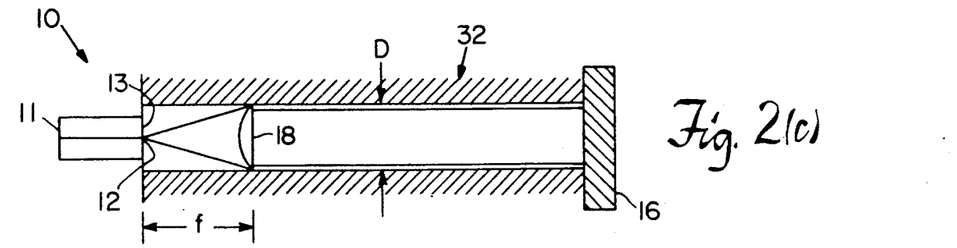
FIG. 2(c) is a side view of a grazing incidence waveguide optical cavity.
Figure 2D:
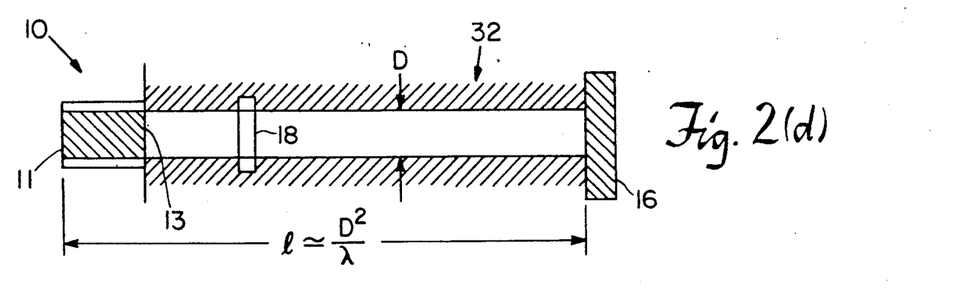
FIG. 2(d) is a top view of the waveguide optical cavity of FIG. 2(c).

Referring to FIG. 2(c), a grazing incidence waveguide optical cavity could be formed from a grazing incidence waveguide 32 attached to a diode laser 10 and a cylinder lens 18 and terminated by a planar output coupling mirror 16. As previously discussed, the length l and width D of the cavity must satisfy the relationship: $D^2/\lambda \sim 1$.

Figure 2E:
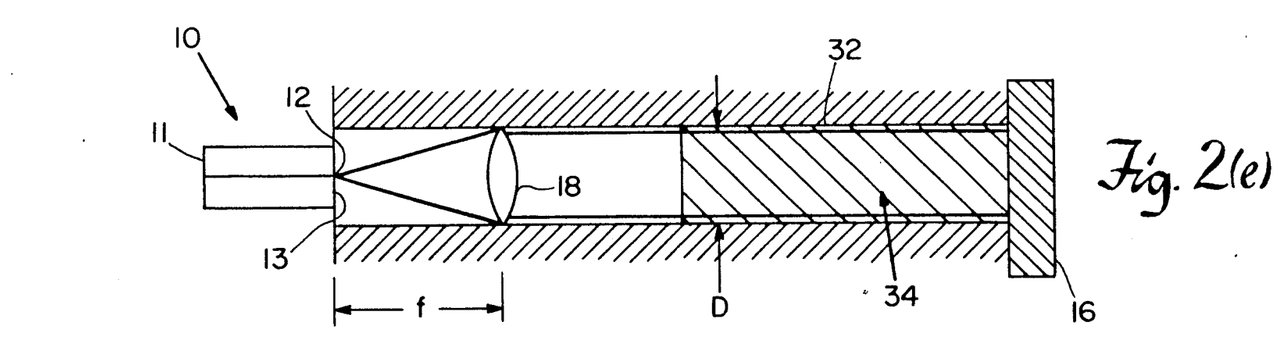
FIG. 2(e) is a side view of a grazing incidence waveguide optical cavity resonator containing a non-linear element.
Figure 2F:
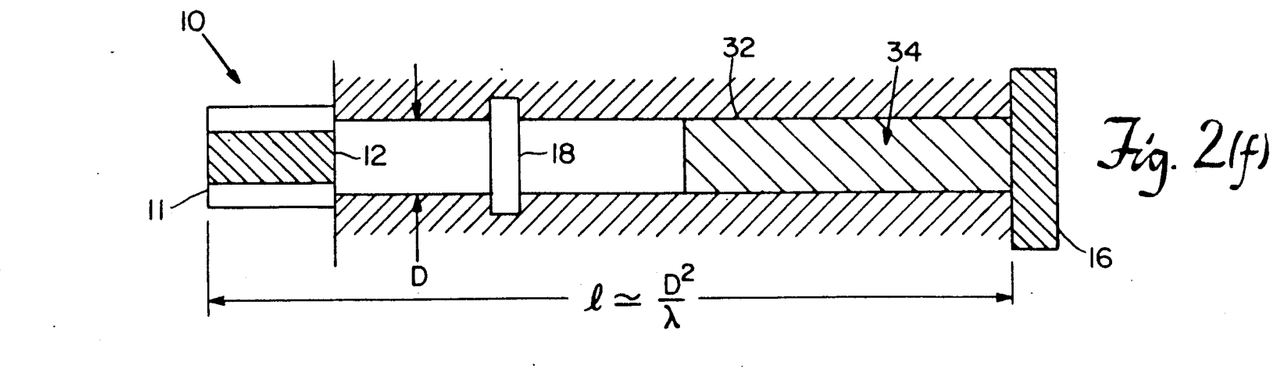
FIG. 2(f) is a top view of the waveguide optical cavity of FIG. 2(g)

In this embodiment, a cylindrical lens 18 is located at its focal length (f) from the laser facet 12 and light through the lens is collimated. As in the embodiment shown in FIGS. 1(c) and (d), the cylindrical lens 18 is oriented to focus light on the facet 12. Another embodiment using this configuration is shown in FIG. 2(e) and (f), in which a non-linear optical material such as potassium niobate is placed within the cavity 32 so as to generate harmonics of the frequency of the diode laser 10. The non-linear material may be coated so as to transmit only selected frequencies.

Figure 3A:
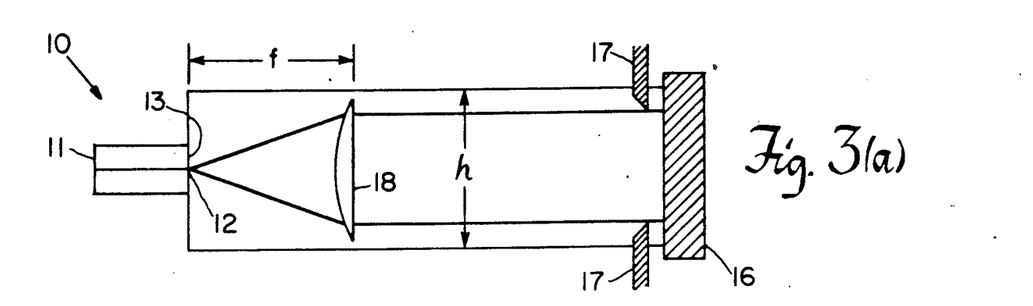
FIG. 3(a) is a schematic illustration of a side view of a combination geometric and waveguide optical cavity.
Figure 3B:
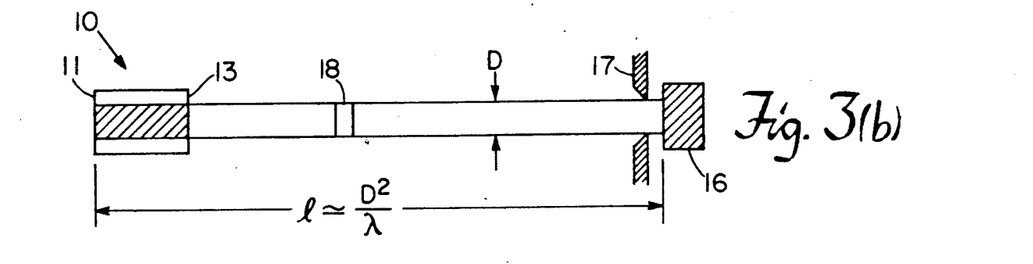
FIG. 3(b) is the top view of the combination geometric and waveguide optical cavity of FIG. 3(a)

Referring to FIG. 3(a), a combination waveguide and geometric optical resonant cavity can be formed by attaching the laser to an external cavity 34 comprising a cylindrical lens 18 located between the laser 10 and the output coupling mirror 16 and choosing the width D and length l of the cavity 34 to satisfy the relationship: $D^2/\lambda \sim 1$, but allowing the height h of the cavity to be much greater than D.

Figure 5A:
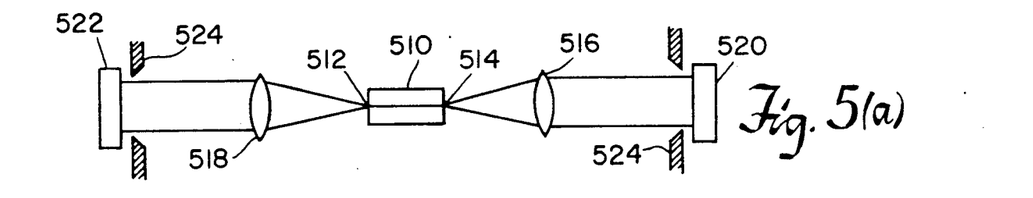
FIG. 5(a) is a schematic illustration of a side view of a single mode waveguide optical cavity resonator with the laser diode within the external cavity.
Figure 5B:
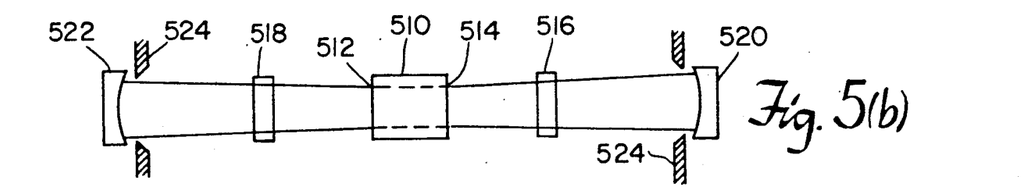
FIG. 5(b) is a top view of the waveguide optical cavity of FIG. 5(a)

A further design could place the diode in the center of an external cavity. This approach is applicable to all of the external cavities discussed here. One embodiment is shown in FIG. 5(a). A diode laser 510 having two facets which are anti-reflection coated 512 and 584, is positioned within a cavity between two lenses 516 and 518. The light from the laser 510 is collimated by the apertures 524 prior to striking the mirrors 520 and 522. One mirror 522 is 100% reflective and reflects the laser light back to the diode laser 510. The other mirror 52 is partially transparent and acts as an output coupler.

Figure 6A:
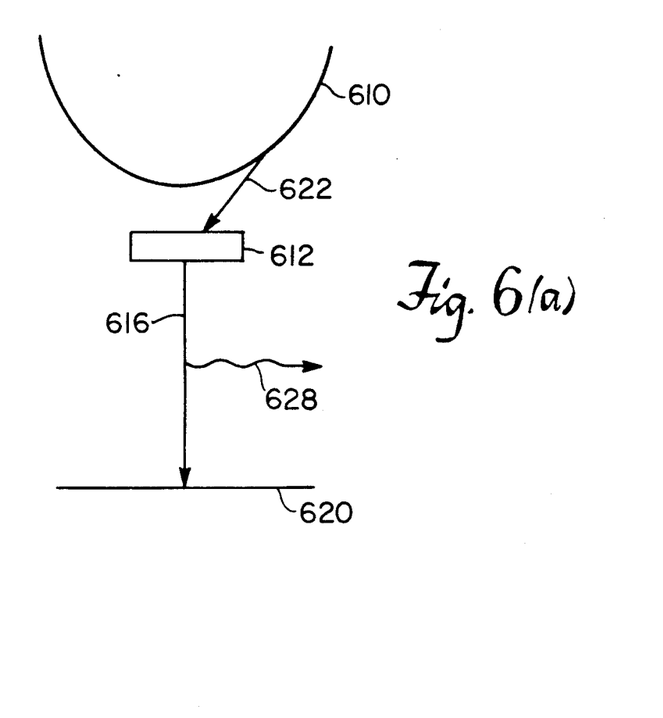
FIG. 6(a) is an energy diagram showing a radiative transition to an impurity band.
Figure 6B:
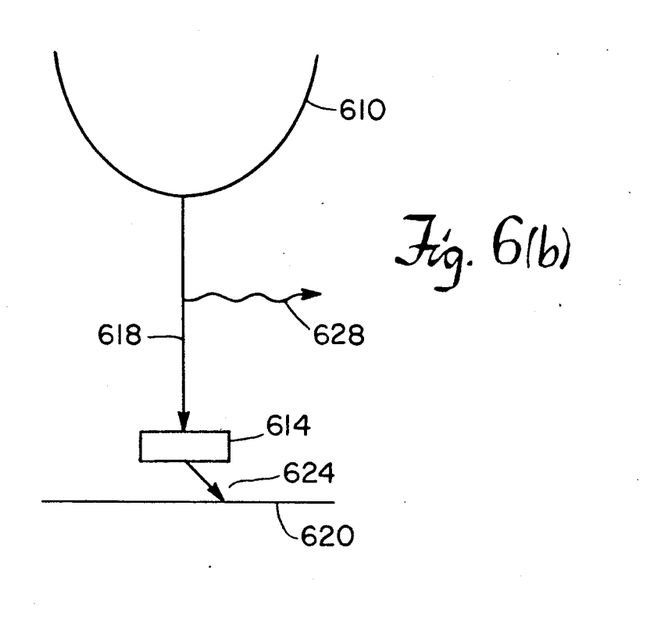
FIG. 6(b) is an energy diagram showing a radiative transition from an impurity band.

One way to use the optical cavity is to tailor the emissions of a laser to produce radiation from impurity levels. In a semiconductor laser, for example, a graded index separate confinement heterostructure (GRIN-SCH) laser, impurity levels can be created which are in the band gap. This configuration is shown in FIG. 6(a), and FIG. 6(b). In FIG. 6(a), an impurity level 612 is located between the excited state 610 and the valence band 620 at an energy near the excited state 610. A non-radiative transition 622 can bring an electron into the impurity level 612. This is then followed by a radiative transition 616 resulting in radiation 628 having energy equal to the energy difference between the valence band 620 and the impurity level 612.

Conversely, FIG. 6(b), the impurity level 614 may be located closer to the valence band 620, in which case a radiative transition 618 can take place between the excited state 610 and the impurity level 614. The photon 628 emitted is then equal in energy to the difference in energy between the excited state 610 and the impurity level 614. All occupied energy states in the conduction or valence bands can participate in the laser transitions.

By using an external cavity such as one of those just described, a radiative transition involving an impurity level may be selected. By judicious selection of impurities and cavities, a laser with tunable frequencies less than those corresponding to the usual band-to-band transitions can be produced.

The external cavity lasers according to the invention exhibit a single frequency output of high intensity. The external cavity may be fabricated easily and at low cost resulting in a high volume, low cost monochromatic source.

Having shown the preferred embodiment, those skilled in the art will realize many variations are possible which will still be within the scope and spirit of the claims invention. Therefore, it is the intention to limit the invention only as indicated by the scope of the claims.

What is claimed is:

1. An external cavity diode laser system comprising a diode laser having a facet and a single active gain region of width D much greater than height H for emitting a single lobe of light and coupled to an external resonator having two ends and comprising beam shaping optics disposed between the ends of the resonator and an output coupling mirror positioned at the end of the resonator opposite the diode laser and optically aligned with the diode laser to focus light from the facet back upon the facet and including a mode aperture dimensioned such that only a single spatial mode of light will propagate in the system and wherein light propagated from the facet in two orthogonal planes travels through the optics in two different paths.

2. The laser system of claim 1 wherein the monolithic diode laser has an anti-reflection coating on one end and high reflection coating on the other end.

3. The laser system of claim 2 wherein the resonator is coupled to the monolithic diode laser at the end of with the anti-reflection coating.

4. The laser system of claim 3 wherein the beam shaping optics is a waveguide located between the diode laser and the output mirror; the output mirror being planar and located at a distance l from the highly reflective end of the diode laser.

5. The laser system of claim 4 in which the length $l \sim D^2/\lambda$, wherein $\lambda$ is the wavelength of the diode laser.

6. The laser system of claim 5 wherein the facet is 150 micrometer.

7. The laser system of claim 6 wherein the length l is about 2.8 cm.

8. The laser system of claim 4 wherein the waveguide is D in height as measured perpendicular to the facet of the diode laser.

9. The laser system of claim 4 wherein the waveguide contains a nonlinear optical element.

10. The laser system of claim 9 wherein the nonlinear optical element is Potassium Niobate.

11. The laser system of claim 3 wherein the beam shaping optics comprises a waveguide and a cylindrical lens.

12. The laser system of claim 11 wherein the waveguide is located between the diode laser and the output mirror; the output mirror being planar and located at a distance l from the highly reflective end of the diode laser.

13. The laser system of claim 1 wherein the diode laser is formed of GaAlAs.

14. The laser system of claim 1 wherein the output mirror is planar and the beam shaping optics comprises a spherical lens of focal length (f) located between the diode laser and the mirror at a distance (f) from each.

15. The laser system of claim 1 wherein said output mirror is spherical with a focal length of (f') and is located at a distance (f') from the diode laser.

16. The laser system of claim 15 wherein the beam shaping optics is a cylindrical lens of focal length (f) and having a flat surface located between the diode laser and the mirror at a distance (f) from said laser and oriented such that the flat surface of the cylindrical lens is coplanar with and parallel to the facet of the diode laser.

17. The laser system of claim 1 wherein the beam shaping optics comprises a spherical lens of focal length (f) located between the diode laser and the mirror and at a distance (f) from the diode laser.

18. The laser system of claim 17 wherein the output mirror is cylindrical having an axis and with a focal length (f') and oriented such that the axis of the cylindrical mirror is coplanar with and parallel to the facet of the diode laser and is located at a distance (f'+f) from the lens.

19. The laser system of claim 1 wherein the beam shaping optics comprises a first lens of focal length $f_1$ and a second lens of focal length $f_2$, wherein both first and second lenses are separated by a distance $(f_1+f_2)$ and are located between the diode laser and the mirror such that the first lens is located at a distance $f_1$ from the diode laser and the second lens is located at a distance $2f_1+f_2$ from the diode laser.

20. The laser system of claim 19 wherein the mirror is planar and is located a distance $f_2$ from the second lens.

21. The laser system of claim 19 wherein the mirror is cylindrical having an axis and with a focal length f' and oriented with said axis coplanar with and parallel to the linear facet of the diode laser and located at a distance $(f_2+f')$ from the second lens.

22. Apparatus comprising a semiconductor diode laser for emitting a single beam of light of wavelength $\lambda$ coupled to a resonant cavity formed of a pair of opposed mirror, said laser having a single active gain region of width D much greater than height H and being coupled to said resonant cavity by a waveguide of length l and wherein $D^2/l\lambda$ is approximately equal to 1.

23. The apparatus of claim 22 further including means within said cavity for generating harmonics of said wavelength.

24. The apparatus of claim 23 wherein the diode laser is located within the cavity.

* * * * *

UNITED STATES PATENT AND TRADEMARK OFFICE
CERTIFICATE OF CORRECTION

PATENT NO. : 5,050,179

DATED : September 17, 1991

INVENTOR(S) : Aram Mooradian

It is certified that error appears in the above-identified patent and that said Letters Patent is hereby corrected as shown below:

Col. 7, line 6, delete "monolithic".

Col. 8, line 39, delete "mirror" and insert ---mirrors---.

Signed and Sealed this

Twenty-third Day of March, 1993

*Attest:*

STEPHEN G. KUNIN

*Attesting Officer*  *Acting Commissioner of Patents and Trademarks*